June 6, 1967 A. J. WILLIAMS, JR., ET AL 3,324,404
CONTROLLER INCLUDING RESET AND PROPORTIONAL ACTIONS
Filed March 25, 1963
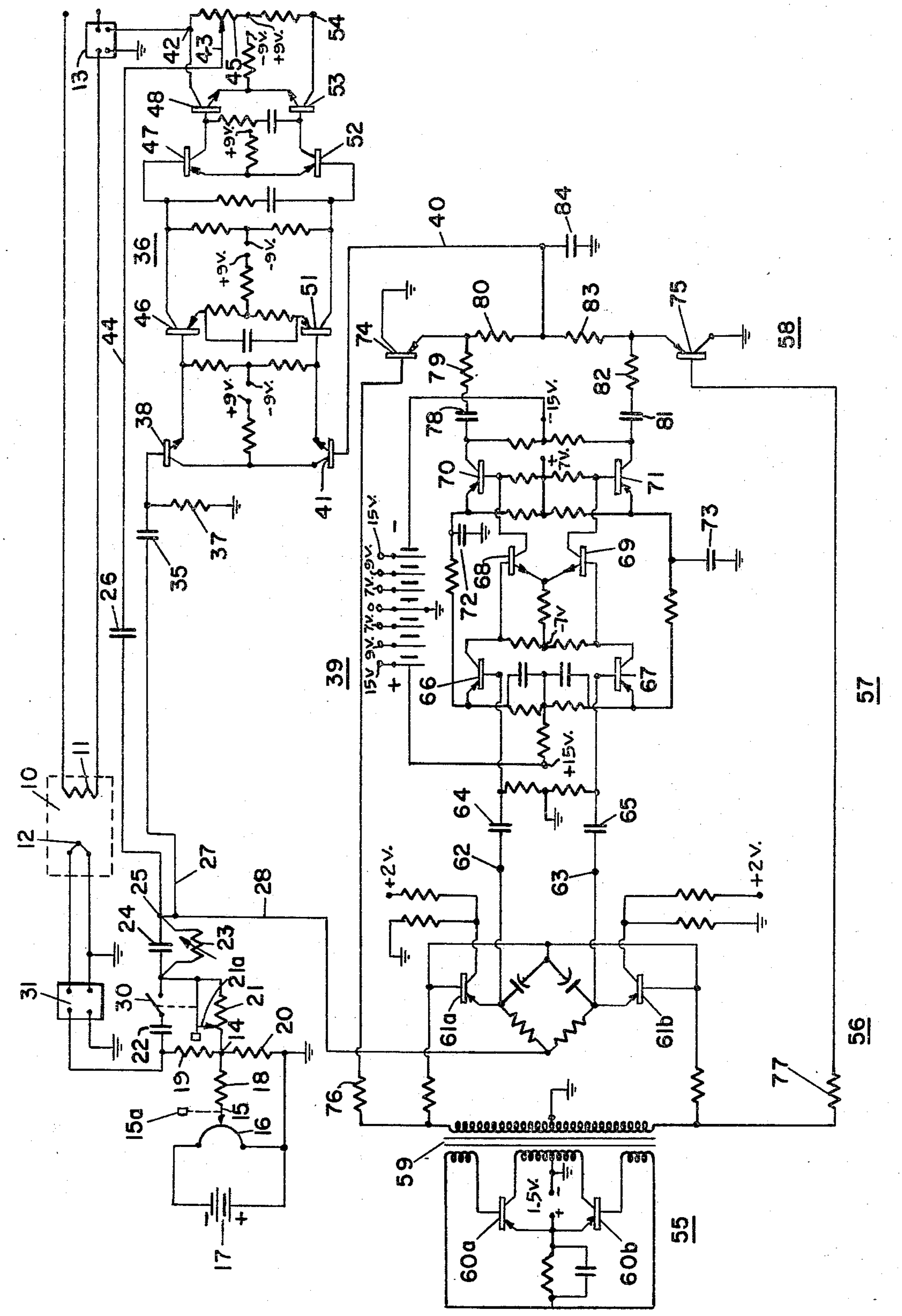

United States Patent Office 3,324,404

Patented June 6, 1967

3,324,404

CONTROLLER INCLUDING RESET AND PROPORTIONAL ACTIONS

Albert James Williams, Jr., Philadelphia, and Norman Edwin Polster, Southampton, Pa., assignors to Leeds and Northrup Company, Philadelphia, Pa., a corporation of Pennsylvania Filed Mar. 25, 1963, Ser. No. 267,719
3 Claims. (Cl. 330—10)

This invention relates to control systems of the type in which reset and proportional actions are desired and has for an object the provision of a system in which said control actions are developed in a unique manner from a pair of amplifiers.

Though controllers including both reset and proportional action are well known to those skilled in the art, much has been left to be desired in here utilizing solid state amplifying devices, such as transistors, and, in particular, developing from amplifiers the two control actions which may be independently adjusted as to magnitude and utilized for a wide variety of control applications.

In carrying out the invention in one form thereof, there is utilized a first amplifier of the wide-band type in conjunction with a second amplifier of the stable-zero type. In the preferred embodiment of the invention both amplifiers are constructed with solid state amplifying devices. Both amplifiers have input circuits extending from a common summing junction for application of the same input signal appearing at the summing junction to the two amplifiers. The amplifier of the stable-zero type has an output connected to an input of the wide-band amplifier. The stable-zero type amplifier serves several functions, one of which includes the stabilization of the zero of the wide-band amplifier. The components corresponding with reset and proportional control actions are developed by means of a single negative feedback circuit including a capacitor extending directly from the output of the wide-band amplifier to the summing junction and thence to the inputs of both of said amplifiers. By providing an input capacitor in series with the feedback capacitor, but disposed between the summing junction and the signal applying means, there is developed the proportional action. A resistor shunting the input capacitor is effective for supplying current to the summing junction and thus for developing the reset action.

Further, in accordance with the invention, the amplifier of the stable-zero type includes a solid state modulating means and a solid state demodulating means together with solid state amplifying stages intermediate thereof for amplification of the input thereto. The input to the amplifier of the stable-zero type is of the low-pass type and passes all signals of low frequency including unidirectional signals and, additionally, includes a component proportional to any drift in the zero of the wide-band amplifier. The wide-band amplifier, on the other hand, has included in an input circuit thereof a high-pass filter substantially to exclude therefrom signals of low frequency including unidirectional signals. The output from the amplifier of the stable-zero type is combined within the wide-band amplifier with the signal at the other input of the wide-band amplifier to provide the desired wide-band response and at the same time to stabilize or prevent effects resulting from any drift of the zero of the wide-band amplifier.

For further objects and advantages of the invention and for a detailed discussion of a preferred embodiment thereof, reference is to be had to the following description taken in conjunction with the drawing in which there has been diagrammatically illustrated a preferred embodiment.

Referring now to the drawing, the invention has been applied to the control of the magnitude of the condition which, as shown, may be the temperature of a compartment 10 such as a furnace or other heat-treating device. The temperature of the device may be elevated by heating resistor 11. Where cooling is desired, the resistor 11 will be replaced by a cooling coil. In either event, a temperature-responsive device, such as the thermocouple 12, will have an output varying with the temperature of compartment 10. The effectiveness of the resistor 11 is under the control of a final control element 13 which may be a magnetic amplifier including a saturable core reactor. This final control element derives its input from the output of the control system now to be described.

As the temperature of compartment 10 varies from a desired set point, as determined by the setting of a contact 15 on the potentiometer slidewire 16 as by a knob 15*a*, an input signal is applied to a summing junction 25, the signal being developed in the following manner. A voltage divider is provided comprising resistors 19 and 20. A rate resistor 21 is connected to their junction point 14. As shown, the rate resistor 21 is effectively removed from circuit by reason of the location of the shunting contact 21*a* at the low or zero end of the rate resistor 21, a switch 30 at that time being in the open position to disconnect the rate capacitor 22 from the circuit. The parts have been illustrated in this position to eliminate, for the moment, a rate action also readily obtained in accordance with the present invention.

It will be observed that the potential at the contact 15 of the potentiometer 16 is applied by way of the resistor 18 to the junction point 14. The junction point 14 is connected to ground by way of resistor 20. When the temperature of compartment 10 is at its desired set point, the current flow through the resistor 20, due to the output from transmitter 31, is equal and opposite to that from potentiometer 16 and zero input signal will be developed between the junction point 14 and ground. Thus, as the temperature of compartment 10 rises above or falls below the set point, the current from the transmitter 31 will increase or decrease relative to that from the slidewire 16 and an input signal will be developed at junction point 14. This input signal is applied to summing junction 25 by way of an input capacitor 24 shunted by a relatively high-valued resistor 23. Their purpose and function will later be described.

It is to be observed that the summing junction 25 connects directly to the conductors 27 and 28. The conductor 27 applies the input signal, by way of a capacitor 35, to the input of a transistorized wide-band amplifier 36. A resistor 37 together with capacitor 35, in effect, forms a high-pass filter. The important function, however, of the capacitor 35 is to isolate the summing junction 25 from any direct current developed at the base of a first transistor 38 of amplifier 36.

The same input signal, applied by way of conductor 27 to the wide-band amplifier 36, is also applied by conductor 28 to the input of an amplifier 39 of the stable-zero type. The stable-zero type amplifier 39 includes a modulator to convert unidirectional input signals to alternating current, intermediate stages of an alternating current amplifier and, finally, a demodulator for development at the output thereof, as at conductor 40, an output signal. The output signal is applied to a second input circuit of the wide-band amplifier 36 as, for example, to the base of a second transistor 41.

As will be later more fully explained, the amplifiers 36 and 39 provide high voltage gain; that is, for a small change of input signal there will be developed at the output of the wide-band amplifier 36 a relatively high voltage at an output terminal 42. It is from this output that the final control element 13 is connected. All or a fractional part of the output signal may be applied as from an adjustable connection 43 to a negative feedback circuit including a conductor 44 and a feedback capacitor 26. By reason of the high gain, the feedback capacitor 26 has an extremely long charging time, which, in terms of the operation of the amplifier, means that changes in the output with time will be extremely slow, assuming, of course, unchanging zero input at the input as, for example, at junction point 14. It is to be noted that the feedback capacitor 26 is connected to the summing junction 25 and thence by way of conductor 27 to one of the input circuits of the wide-band amplifier 36 and by way of conductor 28 to the input circuit of the amplifier 39. Thus, this single feedback capacitor 26 effectively functions in conjunction with the described input circuits of the two amplifiers. This feature alone represents a simplification of circuitry making for reliability of operation and economy in construction.

In order to develop a proportional control action, the input capacitor 24 is included in the circuit between the summing junction 25 and the junction point 14. Thus, with a change in potential at the junction point 14, there will be a change in potential at the summing junction 25. This change will be of a small order of magnitude. However, by reason of the high gain of the amplifiers 36 and 39, there will be a relatively large change of potential on the conductor 44. Mathematically, the input voltage change at junction point 14 multiplied by the capacitance of capacitor 24 will be equal to the voltage change on conductor 44 multiplied by the capacitance of the feedback capacitor 26. From the foregoing, it will be seen that any change in potential at the input junction point 14 will immediately cause a proportional change of output voltage as at output terminal 42 as well as upon feedback conductor 44. Thus, the controller has included the proportional action. Its magnitude may be readily adjusted by varying the position of the contact 43 on the output resistor 45.

There will now be considered the effect of the reset resistor 23 of high resistance connected across capacitor 24. If the effect of the input capacitor 24 be for the moment neglected; i.e., capacitor 24 removed from the circuit, then it will be seen that a voltage developed at the input junction point 14 will cause current to flow to or from the summing junction 25. Current flowing to or from the summing junction 25 initially produces a voltage at summing junction 25 which applied to amplifiers 36 and 39 produces at conductor 44 a greatly amplified voltage. The rate of change of voltage on conductor 44 produces a feedback current flow through capacitor 26 proportional thereto. Because of the large gain of amplifiers 36 and 39, the feedback current is maintained substantially equal in magnitude to input current while summing junction 25 remains approximately at ground potential. Thus, the rate of change of output voltage is proportional to the input current. The requirements of reset have been met; i.e., the output signal will be proportional to the integral with respect to time of the input signal at junction point 14. Stated differently, the requirement is that the feedback current developed at the summing junction 25 shall at all times be equal and opposite to that flowing to that junction from the input junction point 14.

To meet these requirements, as long as current flows to or from summing junction 25 current will, by reason of the action of the amplifiers 36 and 39, be developed by way of feedback conductor 44 and capacitor 26. Since the capacitor 26 is in the circuit, the output voltage at contact 43 must change at that rate which will produce through capacitor 26 and at summing junction 25 feedback current equal and opposite to that flowing from junction point 14. The magnitude of the current flowing from junction point 14 to or from the summing junction 25 will depend upon the value of the reset resistor 23. It has been illustrated as adjustable and this, accordingly, affords a convenient means of varying the magnitude of the reset action developed by the control circuit.

If, in addition to proportional action and reset action, it is desired to actuate the control element 13 in accordance with the additional component of rate action, the contact 21*a* will be moved to include a part of the rate resistor 21 in the circuit at the same time closing the switch 30 to include in the circuit the rate capacitor 22. With the capacitor 22 in the circuit, it will be observed that an abrupt change of voltage from the transmitter 31 will immediately appear, by a more direct path, at the summing junction 25 and thus will provide the input to the amplifiers 36 and 39. If the change of signal at the transmitter 31 be constant at its new value, then the charge on the rate capacitor 22 will change until the voltage across capacitor 22 is equal to the voltage across resistor 19. Thus, the rate action will disappear by reason of the decrease in current through the capacitor 22 and the rate resistor 21. The rate action is developed by the current flow through the rate resistor 21. As long as the input signal is changing then a current will be developed through rate resistor 21 by way of rate capacitor 22. When the input signal is not changing, then the current through capacitor 22 will decay and eventually become zero.

With the above understanding of some of the principal features of the invention, it will be understood that the amplifiers themselves may take different forms, those having been illustrated being of the preferred type, including solid state amplifying devices which, for the purposes of this application, may be defined as including transistors and like equivalent devices.

As already mentioned, an input signal applied by way of conductor 27 and coupling capacitor 35 develops an input signal on transistor 38. The output of transistor 38 is applied to the input of a transistor 46, thence to a transistor 47 and, finally, to a transistor 48. The connections for the transistors 38, 46, 47 and 48 are more or less conventional and provide a high forward gain for development of the high voltage output at output terminal 42.

The above brief description has tacitly assumed the absence of a signal on the transistor 41. When there is a voltage output from amplifier 39, which appears on conductor 40, this voltage is subtracted from the voltage input to the transistor 38 by means of the differential action of the amplifier 36. As an example, assume that the summing junction 25 goes slightly positive. This results in a small positive voltage change being applied to the base of transistor 38 and a positive voltage change being produced at its emitter. As will be subsequently described, a small positive voltage at summing junction 25 applied to the input to amplifier 39 causes a much larger negative voltage change at the output conductor 40. This negative voltage change at the base of the transistor 41 causes a negative voltage change to appear at the emitter of transistor 41 and, because of the differential action of this common collector stage, a positive voltage change at the emitter of transistor 38. The emitter of transistor 41 is connected directly to the base of transistor 51.

Therefore, when the emitter of transistor 41 goes negative, the emitter of transistor 51 is negative-going also. This negative-going voltage at the emitter of transistor 51 causes the collector of transistor 46 to become more negative because of the differential action of the common emitter coupling of transistors 46 and 51.

As previously mentioned, the small positive voltage applied to the base of transistor 38 causes the emitter of transistor 38 to move positively. The emitter of transistor 38 is connected to the base of amplifying transistor 46. Consequently, the collector of transistor 46 moves negatively. The inputs to the bases of transistors 38 and 41 are amplified and the difference of these input potentials is formed at the collector of transistor 46. Similarly, the difference of the two inputs (in the reverse sense) is formed at the collector of transistor 51. These difference potentials are further amplified in the differential stage including transistors 47 and 52 and in the stage including the transistors 48 and 53. The collector of the transistor 48 provides an output potential which is opposite in phase to the input to both amplifiers and multiplied by the large gain of the two amplifiers for low frequency signals.

Referring now to the zero-correcting amplifier 39, this amplifier generally includes a square-wave generator or oscillator 55, a modulator 56, an A.C. amplifier 57 and a demodulator 58.

The square-wave oscillator 55 is of conventional type including a saturable reactor 59 and two transistors **60*a* and 60*b* which are rendered alternately conducting by means of feedback from the windings of the saturable reactor 59**.

The square-wave oscillator 55 applies oppositely phased voltages to the transistors **61*a* and 61*b* in the modulator 56. The transistors 61*a* and 61*b* each conduct on opposite alternate half cycles. The input potential on conductor 28 first appears at the point 62 when the transistor 61*a* is cut off, and then appears at the point 63 when the transistor 61*b* is cut off. An A.C. voltage of phase and magnitude related to the D.C. input is coupled through the capacitors 64 and 65 to the A.C. amplifier 57**.

The A.C. signal coupled through the capacitors 64 and 65 is amplified in the amplifier 57 which includes three differential stages. The first differential stage includes transistors 66 and 67. The double-ended output from this stage is applied to transistors 68 and 69 and the output from this second differential stage is applied to transistors 70 and 71 which form the third differential amplification stage. In order to stabilize the operating potential of the differential amplifier circuit, negative D.C. feedback is provided from the third stage to the first stage. For this purpose, the emitter of transistor 70 is coupled to the emitter of transistor 66 and the emitter of transistor 71 is coupled to the emitter of transisor 67. Both of these feedback paths are decoupled for A.C. by capacitors 72 and 73, respectively, which by-pass A.C. components to ground.

The output of the final differential amplification stage is demodulated by the transistors 74 and 75. The output of the square-wave oscillator 55 is coupled by means of resistors 76 and 77 to the bases of transistors 74 and 75, respectively. The transistors 74 and 75 are rendered conducting on alternate half cycles by the output from the square-wave oscillator 55. When the transistor 75 is rendered conducting, the voltage on the collector of transistor 70 is coupled through capacitor 78, resistor 79 and resistor 80 to the output conductor 40. On the next half cycle, when the transistor 74 is conducting, the voltage on the collector of transistor 71 is coupled through capacitor 81 and resistors 82 and 83 to the output conductor 40. Because the alternate conduction of transistors 74 and 75 alternately couples the two outputs of the differential amplifier 57 to the output conductor 40, the double-ended A.C. output of amplifier 57 is demodulated to a D.C.

output on conductor 40. This demodulation is further aided by the capacitor 84 which tends to smooth the output on conductor 40. The potential on conductor 40 forms the second input to differential wide-band amplifier 36, as previously described.

For example, it was found that for stable-zero amplifier 39 having a voltage offset of less than 1 millivolt and a current offset of less than $10^{-9}$ amperes with a 10 microfarad feedback capacitor 26 that the drift rate was no greater than 10 volts in 100,000 seconds. Stated another way, the input to the amplifier is maintained within a tolerance of 1 millivolt when the output of the wide-band amplifier is within its operating range of 10 volts.

While a particular embodiment of the invention has been shown and described, it will, of course, be understood that various changes may be made without departing from the principles of the invention. The appended claims are, therefore, intended to cover any such modifications within the true spirit and scope of the invention.

What is claimed is:

1. A control system comprising:
- a wide-band transistor amplifier having two input circuits for providing a differential output,
- a summing junction connected to a first of said input circuits of said wide-band amplifier,
- a device responsive to the changes in magnitude of the condition to be controlled for applying input signals to said summing junction,
- an AC amplifier, including at least one two-transistor differential amplification stage,
- modulating means connected between the summing junction and the input circuit of said AC amplifier, said modulating means including
  - two transistors, said two transistors being connected for alternate conduction, the voltage at said summing junction being applied to said two transistors, said two transistors producing a double-ended AC output signal indicative of said voltage at said summing junction, said double-ended AC output signal being applied to the bases of the two transistors in said two-transistor differential amplification stage,
- demodulating means, the double-ended output of said AC amplifier being connected to said demodulating means, said demodulating means producing a signal representative of variations in the level of said input signals,
- a single negative feedback circuit including only a capacitive element having only two terminals, one of said terminals being connected to the output of said wide-band amplifier, the other of said terminals being connected only to said summing junction, said capacitive element also serving to block the DC component of the signal at the output of said wide-band amplifier from said summing junction,
- an input capacitor connected between said device and said summing junction for developing proportional action,
- a resistor shunting said input capacitor for supplying current to said summing junction for developing reset action, and
- a DC isolation capacitor connected between said summing junction and said first input circuit of said wide-band amplifier to isolate said summing junction from direct current developed at said first input circuit of said wide-band amplifier.

2. The control system of claim 1 in which each input circuit of said wide-band amplifier comprises a transistor amplifier, one of said transistor amplifiers being coupled to said summing junction by way of said isolation capacitor and a second of said transistor amplifiers being conductively coupled to the output of said demodulating means, said modulating means and said demodulating means respectively being of the transistor type.

3. The control system of claim 1 wherein said wide-band amplifier includes at least one two-transistor differential amplification stage, one of said input circuits to said wide-band amplifier being connected to the base of one of the transistors in said last-named differential amplification stage, the other of said input circuits to said wide-band amplifier being connected to the base of the other of said transistors in said last-named differential amplification stage, the collector of one of the transistors in the last differential amplification stage being connected to the output of said wide-band amplifier.

References Cited

UNITED STATES PATENTS

| | | | |
|---|---|---|---|
| 2,910,585 | 10/1959 | Baring et al. ---------- | 328—69 |
| 3,065,428 | 11/1962 | Richman ------------ | 330—9 |
| 3,088,076 | 4/1963 | Burwen --------------- | 330—9 |
| 3,147,446 | 9/1964 | Wittenberg ------------ | 330—9 |

ROY LAKE, *Primary Examiner.*

NATHAN KAUFMAN, *Examiner.*